(12) United States Patent
Tihanyi

(10) Patent No.: US 7,375,395 B2
(45) Date of Patent: May 20, 2008

(54) VERTICAL FIELD-EFFECT TRANSISTOR IN SOURCE-DOWN STRUCTURE

(75) Inventor: Jenö Tihanyi, Kirchheim (DE)

(73) Assignee: Infineon Technologies Austria AG, Villach (AT)

(*) Notice: Subject to any disclaimer, the term of this patent is extended or adjusted under 35 U.S.C. 154(b) by 397 days.

(21) Appl. No.: 11/233,472

(22) Filed: Sep. 22, 2005

(65) Prior Publication Data

US 2006/0076615 A1    Apr. 13, 2006

(30) Foreign Application Priority Data

Sep. 22, 2004  (DE) .................. 10 2004 045 966

(51) Int. Cl.
*H01L 29/94* (2006.01)
*H01L 29/76* (2006.01)

(52) U.S. Cl. .......... 257/328; 257/330; 257/331; 257/329; 257/332; 438/268; 438/270; 438/272

(58) Field of Classification Search ............ 257/328, 257/330, 331, 329, 332; 438/268, 270, 272

See application file for complete search history.

(56) References Cited

U.S. PATENT DOCUMENTS

| 6,284,604 B1 | 9/2001 | Tihanyi |
| 6,373,097 B1 | 4/2002 | Werner |
| 2004/0089896 A1* | 5/2004 | Sakakibara ............ 257/330 |

FOREIGN PATENT DOCUMENTS

| DE | 102 49 633 A1 | 5/2004 |
| EP | 0 440 394 A2 | 1/1991 |

* cited by examiner

*Primary Examiner*—Kenneth Parker
*Assistant Examiner*—Joseph Nguyen
(74) *Attorney, Agent, or Firm*—Maginot, Moore & Beck

(57) ABSTRACT

The invention relates to a vertical field-effect transistor in source-down structure, in which the active zones (10, 7, 11) are introduced from trenches (5, 8, 9) into a semiconductor body (1), a source electrode (18) being connected via the filling (6) of a body trench (5) to a highly doped substrate (2) via a conductive connection (15).

20 Claims, 2 Drawing Sheets

VERTICAL FIELD-EFFECT TRANSISTOR IN SOURCE-DOWN STRUCTURE

FIELD OF THE INVENTION

The present invention relates to a vertical field-effect transistor (FET) in source-down structure. The term "source-down structure" is to be understood as meaning that in the vertical FET, drain and gate terminals are located on one side (top side) of a semiconductor body, while the source terminal is located on the other side (underside) of the semiconductor body.

BACKGROUND

A high packing density has long been the aim in very general terms in semiconductor technology and therefore also for vertical FETs. Furthermore, there are applications in which it is desirable for the source terminal of an FET to be located on the underside of a semiconductor body. This applies, for example, to semiconductor components, the source terminal of which is at reference potential and which require good cooling. One possible application area is FETs for the automotive industry.

SUMMARY

It is an object of the present invention to provide a vertical FET with a high packing density in a source-down structure.

These objects are achieved by embodiments of the invention.

The vertical field-effect transistor in source-down structure according to the invention therefore comprises in particular:

a semiconductor body comprising a semiconductor substrate of a first conduction type, on which a semiconductor layer of the other conduction type, opposite to the first conduction type, is provided, which semiconductor layer for its part forms a main surface of the semiconductor body. The first conduction type is in this context preferably the p-conduction type.

At least one first trench extends from one main surface to the semiconductor substrate. This at least one first trench is at least partially surrounded by a zone of the first conduction type and is filled with polycrystalline semiconductor material which is doped with a dopant of the first conduction type. It is preferable for the zone of the first conduction type to completely surround the at least one trench, and in particular polycrystalline silicon is selected for the polycrystalline semiconductor material.

Furthermore, at least one second trench and at least one third trench extend from one main surface into the semiconductor layer without reaching the semiconductor substrate. These second and third trenches, in a first direction on the main surface, in each case lie on one side or the other of the first trench and are each at least partially surrounded by a zone of the other conduction type. Like the first trench, the second and third trenches are also filled with polycrystalline semiconductor material, in particular polycrystalline silicon, which is doped with a dopant of the other conduction type. It is preferable for the second and third trenches also each to be completely surrounded by a zone of the other conduction type.

A fourth trench likewise extends from one main surface into the semiconductor layer and is lined with an insulating layer on its walls and base. This fourth trench is filled with conductive material. On the main surface, in the first direction it is located at a distance from the first trench and in a second direction, substantially perpendicular to the first direction, it is located at a distance from the second and third trenches. The at least one fourth trench may but does not have to extend as far as the semiconductor substrate. Doped polycrystalline semiconductor material, in particular polycrystalline silicon, or a metal can be selected for the conductive material.

On one main surface, there is preferably a conductive connection, for which, for example, doped polycrystalline semiconductor material, in particular silicon, can likewise be used, between the polycrystalline semiconductor material of the second trench and the polycrystalline semiconductor material of the first trench.

Finally, there is also a source electrode, which is electrically connected to the semiconductor substrate, i.e. the underside of the semiconductor body, a drain electrode, which is electrically connected to the polycrystalline semiconductor material of the fourth trench on the one main surface, and a gate electrode, which is electrically connected to the conductive material of the at least one fourth trench, likewise on the one main surface.

The vertical FET in source-down structure according to the invention is distinguished by a very high packing density, since all the zones are contact-connected via trenches. Moreover, in this FET, on account of the conductive connection between the polycrystalline semiconductor material of the second trench and the polycrystalline semiconductor material of the first trench, the source terminal lies on the underside of the semiconductor body, which is on the opposite side from the one main surface.

BRIEF DESCRIPTION OF THE DRAWINGS

The text which follows provides a more detailed explanation of an exemplary embodiment of the invention with reference to the drawings, in which.

DETAILED DESCRIPTION

Figure 1:
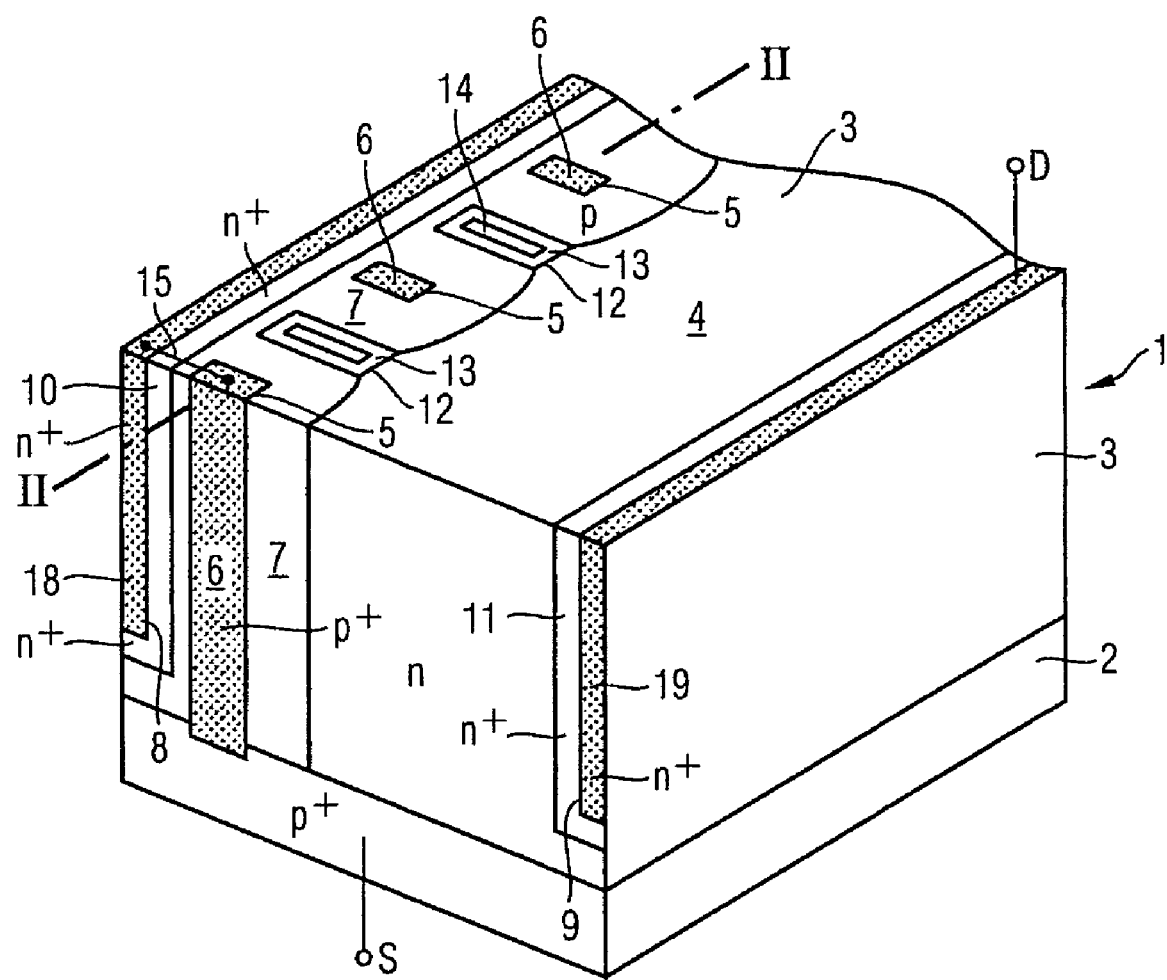
FIG. 1 shows a perspective illustration of the vertical FET according to the invention.
Figure 2:
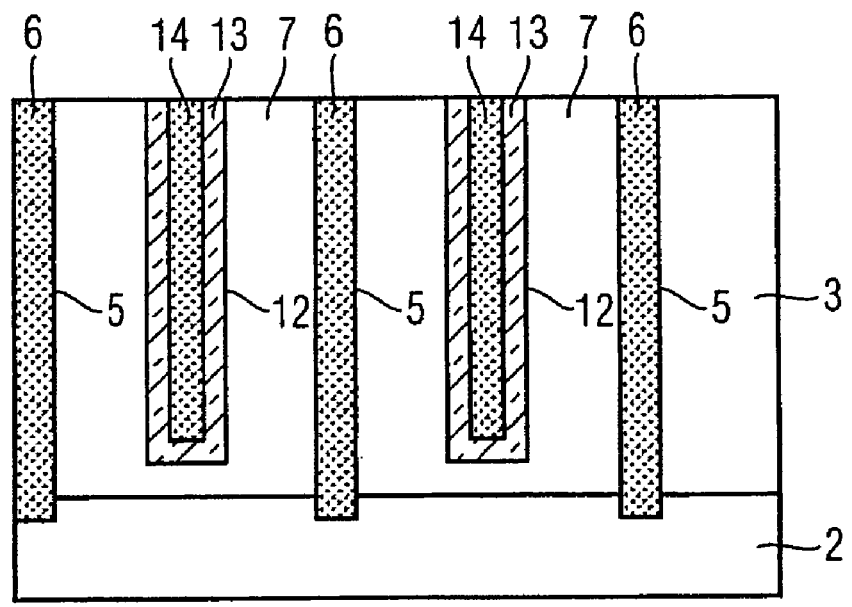
FIG. 2 shows a section II-II through the FET shown in FIG. 1.

FIGS. 1 and 2 show a semiconductor body 1 comprising a $p^+$-conducting semiconductor substrate 2 and an n-conducting semiconductor layer 3 which has been applied to it by epitaxy. The semiconductor substrate 2 and the semiconductor layer 3 preferably consist of silicon. However, it is also possible to select other semiconductor materials, such as for example SiC, compound semiconductors $A_{III}B_V$, etc. It is also possible for the conduction types indicated to be reversed, i.e. the p-type conductivity may be replaced by the n-type conductivity if the p-type conductivity is selected instead of the n-type conductivity.

First trenches 5, which extend as far as the semiconductor substrate 2, are filled with $p^+$-doped polycrystalline silicon 6 and have been formed in particular by etching, are provided in the semiconductor layer 3 leading from the main surface 4 thereof on the opposite side from the semiconductor substrate. p-Type dopant, for example boron, has been introduced from this polycrystalline silicon 6 into the region of the semiconductor layer 3 surrounding the trenches 5, so as to form a continuous p-doped zone 7 which preferably completely surrounds the trenches 5. The zone 7 has therefore been produced by outdiffusion from the p⁺-doped polycrystalline silicon 6 from trenches 5. The trenches 5 number at least one. If appropriate, it is, however, also possible to provide a plurality of trenches, as shown in the exemplary embodiment illustrated in FIGS. 1 and 2.

Furthermore, at least one second trench 8 and at least one third trench 9 are provided, likewise extending from the first main surface 4 into the semiconductor layer 3, but without reaching the semiconductor substrate 2. The trenches 8 and 9 have likewise been produced by etching, in each case run in a first direction (sectional plane shown in FIG. 2) and lie on one side or the other side, respectively, of the direction of extent of the first trenches 5. Like the first trenches 5, the trenches 8 and 9 are filled with polycrystalline semiconductor material, in particular polycrystalline silicon 18 or 19, which in this case, however, is n⁺-conducting in the trenches 8 and 9. n-Conducting dopant, for example phosphorus or arsenic, has diffused out of the trenches 8 and 9 into the region of the semiconductor layer 3 surrounding the trenches 8 and 9, so as to in each case form n⁺-conducting zones 10 and 11.

Finally, fourth trenches 12 have likewise been introduced by etching from the main surface 4 into the semiconductor layer 3; these trenches may extend all the way to the semiconductor substrate 2, but may also end in the semiconductor layer 3 before they reach the semiconductor substrate 2. These fourth trenches 12 are lined with an insulating layer 13 of, for example, silicon dioxide and/or silicon nitride on their walls and their base and are otherwise filled with conductive material 14, such as in particular doped polycrystalline silicon and/or metal.

The polycrystalline semiconductor material 6 of the trench 5 is connected to the n⁺-doped polycrystalline semiconductor material 18 in the trench 8 via a conductive connection 15, for example likewise comprising doped polycrystalline silicon. This conductive connection 15 is preferably formed on the main surface 4 before a drain metallization layer (not shown) is applied over the whole of this surface. Of course, this conductive connection 15 is electrically isolated from this drain metallization by an insulation layer, for example of silicon dioxide.

Therefore, the trench 9 with the polycrystalline semiconductor material 19 which has been introduced into it forms a drain trench, while the trench 8 with the doped polycrystalline semiconductor material 18 which has been introduced into it forms a source trench. As a result of the conductive connection 15, the polycrystalline semiconductor material 18 of the source trench is directly electrically connected, via the polycrystalline semiconductor material 6 of the trench 5, to the semiconductor substrate 2, resulting in a source-down structure.

Whereas the trenches 5, 8 and 9 extend in the first direction, the trenches 12 which form gate trenches extend in a second direction, which is perpendicular to the first direction.

Figure 3:
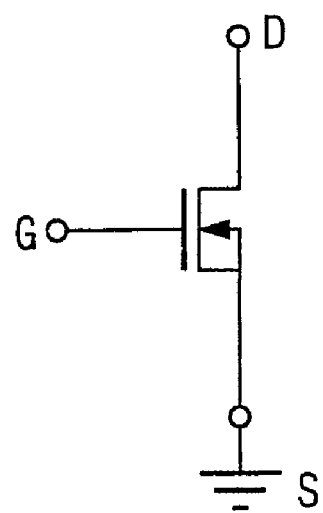
FIG. 3 shows an equivalent circuit diagram for the FET according to the invention.

The semiconductor substrate 2 is connected to a source electrode S, which is preferably earthed (cf. FIG. 3), while the polycrystalline semiconductor material 19 of the drain trench 9 is connected to a drain electrode D. Furthermore, the conductive material 14 of the trenches 12 is connected to a gate electrode G.

The vertical FET in source-down structure according to the invention is distinguished by a very high packing density, since all the zones have been introduced via trenches.

The invention claimed is:

1. A vertical field-effect transistor in source-down structure, comprising:

a semiconductor body comprising a semiconductor substrate of a first conduction type, and a semiconductor layer of a second conduction type, opposite to the first conduction type, the semiconductor layer disposed on the semiconductor substrate and forming a main surface of the semiconductor body;

at least one first trench extending from the main surface to the semiconductor substrate, the first trench at least partially surrounded by a zone of the first conduction type and filled with polycrystalline semiconductor material which is doped with a dopant of the first conduction type;

at least one second trench and at least one third trench, each extending from the main surface into the semiconductor layer without reaching the semiconductor substrate, the first trench disposed between the second trench and the third trench with respect to a first direction, each of the second and third trenches at least partially surrounded by respective zones of the second conduction type and filled with polycrystalline semiconductor material which is doped with a dopant of the second conduction type;

at least one fourth trench extending from the main surface into the semiconductor layer, the fourth trench having walls and a base lined with an insulating layer, the fourth trench filled with conductive material and, in the first direction, is located at a distance from the first trench, and in a second direction, substantially perpendicular to the first direction, is located at a distance from the second and third trenches;

a conductive connection between the polycrystalline semiconductor material of the second trench and the polycrystalline semiconductor material of the first trench;

a source electrode electrically connected to the semiconductor substrate;

a drain electrode electrically connected to the polycrystalline semiconductor material of the third trench; and a gate electrode electrically connected to the conductive material of the fourth trench.

2. The vertical field-effect transistor according to claim 1, wherein the first conduction type is the p-conduction type.

3. The vertical field-effect transistor according to claim 1, wherein the first trench is completely surrounded by the zone of the first conduction type.

4. The vertical field-effect transistor according to claim 1, wherein the second trench is completely surrounded by one of the zones of the second conduction type.

5. The vertical field-effect transistor according to claim 1, wherein the polycrystalline semiconductor material in the first, second and third trenches comprises polycrystalline silicon.

6. The vertical field-effect transistor according to claim 1, wherein the insulating layer in the fourth trench is formed from at least one of the group consisting of silicon dioxide and silicon nitride.

7. The vertical field-effect transistor according to claim 1, wherein the conductive material in the fourth trench is doped polycrystalline silicon.

8. The vertical field-effect transistor according to claim 1, wherein the conductive material in the fourth trench is doped metallic material.

9. The vertical field-effect transistor according to claim 1, wherein the conductive connection is formed from doped polycrystalline silicon.

10. The vertical field-effect transistor according to claim 1, wherein the conductive connection is provided on the main surface.

11. The vertical field-effect transistor according to claim 1, wherein the fourth trench extends as far as the semiconductor substrate.

12. An arrangement for use in a field-effect transistor, comprising:
- a semiconductor body comprising a semiconductor substrate and of a first conduction type and a semiconductor layer of a second conduction type, at least a part of the semiconductor substrate forming a source of the field-effect transistor, the semiconductor layer disposed on the semiconductor substrate and forming a main surface of the semiconductor body;
- at least a first trench extending from the main surface to the semiconductor substrate, the first trench at least partially surrounded by a zone of the first conduction type and filled with polycrystalline semiconductor material which is doped with a dopant of the first conduction type;
- at least a second trench and at least a third trench, each extending from the main surface into the semiconductor layer without reaching the semiconductor substrate, the first trench disposed between the second trench and the third trench with respect to a first direction, each of the second and third trenches at least partially surrounded by respective zones of the second conduction type and filled with polycrystalline semiconductor;
- at least one fourth trench extending from the main surface into the semiconductor layer, the fourth trench having walls and a base lined with an insulating layer, the fourth trench filled with conductive material and, in the first direction, is located at a distance from the first trench, and in a second direction, substantially perpendicular to the first direction, is located at a distance from the second and third trenches;
- a conductive connection between the polycrystalline semiconductor material of the second trench and the polycrystalline semiconductor material of the first trench.

13. The arrangement according to claim 12, wherein the first conduction type is the p-conduction type.

14. The arrangement according to claim 12, wherein the first trench is completely surrounded by the zone of the first conduction type.

15. The arrangement according to claim 12, wherein the second trench is completely surrounded by one of the zones of the second conduction type.

16. The arrangement according to claim 12, wherein the polycrystalline semiconductor material in the first, second and third trenches comprises polycrystalline silicon.

17. The arrangement according to claim 12, wherein the insulating layer in the fourth trench is formed from at least one of the group consisting of silicon dioxide and silicon nitride.

18. The arrangement according to claim 12, wherein the conductive material in the fourth trench is doped polycrystalline silicon.

19. The arrangement according to claim 12, wherein the conductive material in the fourth trench is doped metallic material.

20. The arrangement according to claim 12, wherein the conductive connection is formed from doped polycrystalline silicon.

* * * * *